(12) United States Patent
Zhang et al.

(10) Patent No.: US 11,696,407 B2
(45) Date of Patent: Jul. 4, 2023

(54) CORE LAYER WITH FULLY ENCAPSULATED CO-AXIAL MAGNETIC MATERIAL AROUND PTH IN IC PACKAGE SUBSTRATE

(71) Applicant: Intel Corporation, Santa Clara, CA (US)

(72) Inventors: Chong Zhang, Chandler, AZ (US); Ying Wang, Chandler, AZ (US); Junnan Zhao, Gilbert, AZ (US); Cheng Xu, Chandler, AZ (US); Yikang Deng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/560,004

(22) Filed: Dec. 22, 2021

(65) Prior Publication Data

US 2022/0117089 A1  Apr. 14, 2022

Related U.S. Application Data

(62) Division of application No. 15/910,288, filed on Mar. 2, 2018, now Pat. No. 11,246,218.

(51) Int. Cl.
*H01L 23/495* (2006.01)
*H05K 1/16* (2006.01)
(Continued)

(52) U.S. Cl.
CPC ......... *H05K 1/165* (2013.01); *H01F 17/0013* (2013.01); *H01F 27/2804* (2013.01);
(Continued)

(58) Field of Classification Search
CPC . H05K 1/165; H01L 21/486; H01L 23/49827; H01L 23/49838; H01L 2924/19043; H01L 2924/1427
(Continued)

(56) References Cited

U.S. PATENT DOCUMENTS 6,087,719 A    7/2000  Tsunashima
9,959,964 B2 *  5/2018  Yun .......................... H01F 10/12
(Continued)

*Primary Examiner* — Nitin Parekh
(74) *Attorney, Agent, or Firm* — Schwabe, Williamson & Wyatt, P.C.

(57) ABSTRACT

Embodiments may include inductors with embedded magnetic cores and methods of making such inductors. In an embodiment, an integrated circuit package may include an integrated circuit die with a multi-phase voltage regulator electrically coupled to the integrated circuit die. In such embodiments, the multi-phase voltage regulator may include a substrate core and a plurality of inductors. The inductors may include a conductive through-hole disposed through the substrate core and a plugging layer comprising a dielectric material surrounding the conductive through-hole. In an embodiment, a magnetic sheath is formed around the plugging layer. In an embodiment, the magnetic sheath is separated from the plated through hole by the plugging layer. Additionally, a first layer comprising a dielectric material may be disposed over a first surface of the magnetic sheath, and a second layer comprising a dielectric material may be disposed over a second surface of the magnetic sheath.

21 Claims, 9 Drawing Sheets

(51) Int. Cl.
| | |
|---|---|
| H01L 23/498 | (2006.01) |
| H01L 21/48 | (2006.01) |
| H05K 1/11 | (2006.01) |
| H05K 3/00 | (2006.01) |
| H05K 3/42 | (2006.01) |
| H01F 41/04 | (2006.01) |
| H01F 27/28 | (2006.01) |
| H01F 17/00 | (2006.01) |
| H05K 3/06 | (2006.01) |
| H01L 23/00 | (2006.01) |

(52) U.S. Cl.
CPC ........ *H01F 41/041* (2013.01); *H01F 41/046* (2013.01); *H01L 21/486* (2013.01); *H01L 23/49827* (2013.01); *H01L 23/49838* (2013.01); *H05K 1/115* (2013.01); *H05K 3/0026* (2013.01); *H05K 3/0047* (2013.01); *H05K 3/422* (2013.01); *H01F 2017/002* (2013.01); *H01L 23/49816* (2013.01); *H01L 24/16* (2013.01); *H01L 2224/16225* (2013.01); *H01L 2924/1427* (2013.01); *H01L 2924/19042* (2013.01); *H01L 2924/19102* (2013.01); *H05K 3/06* (2013.01); *H05K 2201/10378* (2013.01); *H05K 2201/10734* (2013.01); *H05K 2203/072* (2013.01); *H05K 2203/107* (2013.01)

(58) Field of Classification Search
USPC .......................................... 257/724
See application file for complete search history.

(56) References Cited

U.S. PATENT DOCUMENTS

| | | | |
|---|---|---|---|
| 2006/0148250 A1 | 7/2006 | Kirby | |
| 2008/0143468 A1* | 6/2008 | Yokoyama | H01F 27/292 336/200 |
| 2010/0032808 A1 | 2/2010 | Ding | |
| 2014/0092574 A1* | 4/2014 | Zillmann | H01L 23/481 29/832 |
| 2014/0367828 A1 | 12/2014 | Colonna | |
| 2015/0200050 A1* | 7/2015 | Nakao | H01F 17/04 336/200 |
| 2015/0255529 A1* | 9/2015 | Wang | H01L 21/31 438/3 |
| 2015/0303974 A1* | 10/2015 | Domino | H04B 1/006 455/77 |
| 2016/0276424 A1* | 9/2016 | Duevel | H01L 23/481 |
| 2019/0279806 A1* | 9/2019 | Darmawikarta | H01F 27/2804 |

\* cited by examiner

CORE LAYER WITH FULLY ENCAPSULATED CO-AXIAL MAGNETIC MATERIAL AROUND PTH IN IC PACKAGE SUBSTRATE

CROSS-REFERENCE TO RELATED APPLICATIONS

This application is a division of U.S. patent application Ser. No. 15/910,288, filed on Mar. 2, 2018, the entire contents of which is hereby incorporated by reference herein.

TECHNICAL FIELD

Embodiments of the present disclosure relate to power management solutions, and in particular to methods and apparatuses that include embedded magnetic sheaths for use in co-axial inductors.

BACKGROUND

Efficient power management is crucial for many integrated circuit (IC) technologies, especially for high end server devices. Currently, voltage regulation in some ICs may be implemented with imbedded voltage regulators. Such embedded voltage regulators often use air coil inductors (ACIs) formed by plating through hole walls with copper. However, ACIs may not provide the desired inductance. In order to increase the inductance, more ACIs may be formed in series. This increases the overall footprint of the voltage regulators. Additional solutions for increasing the inductances of ACIs have been proposed. For example, a magnetic sheath material may be positioned inside and around the coil.

However, the introduction of magnetic materials results in disruptions to currently used manufacturing processes. The magnetic materials leach and negatively affect chemistries used in the processing of IC substrates. For example, exposed magnetic materials may result in bath contamination during desmear, electroless copper plating, and subtractive etching processes.

EMBODIMENTS OF THE PRESENT DISCLOSURE

Figure 1A:
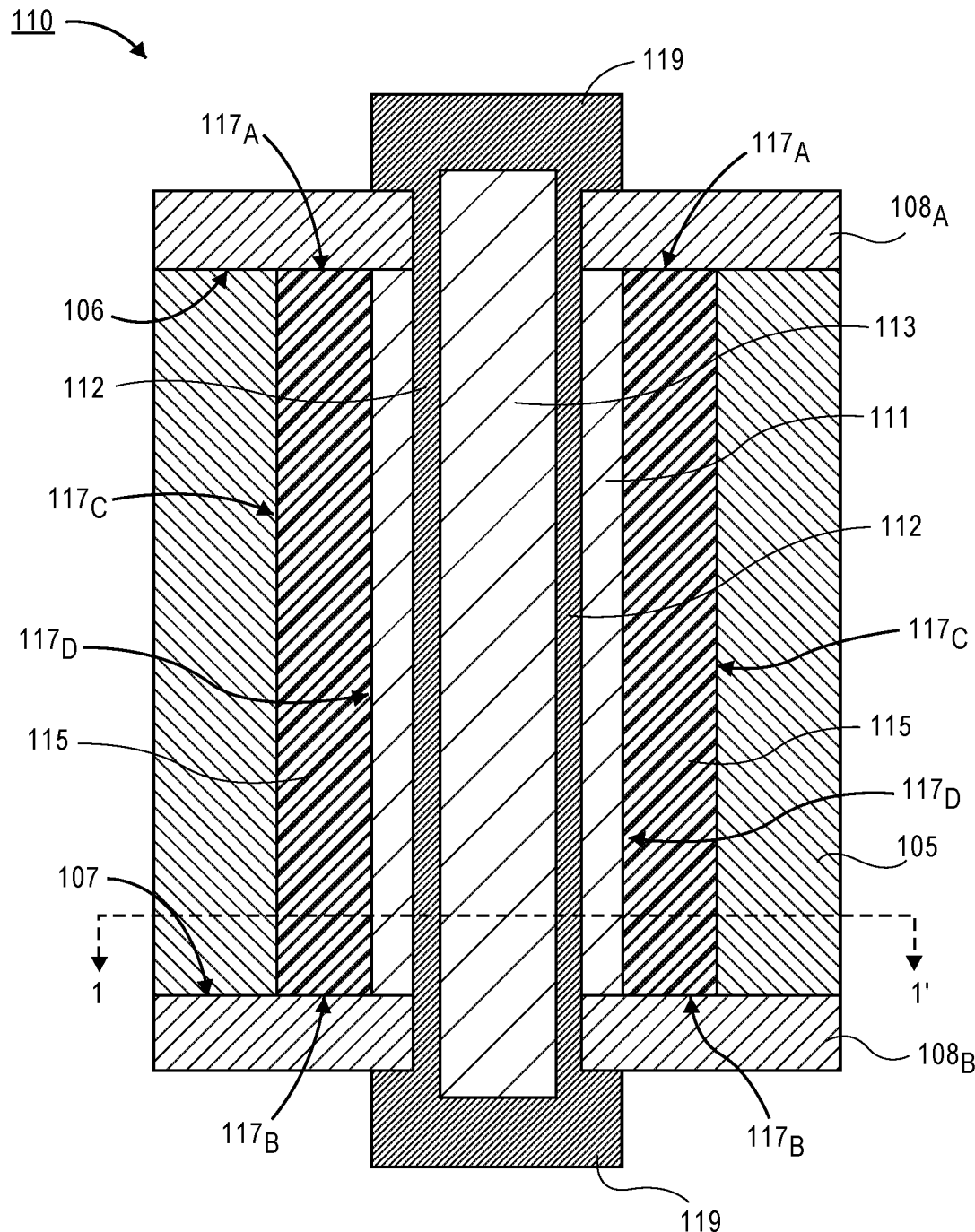
FIG. 1A is a cross-sectional illustration of an inductor with a fully encapsulated co-axial magnetic material around a plated through-hole, in accordance with an embodiment.

Described herein are systems with fully embedded magnetic materials on IC substrates and methods of forming such systems. More particularly, embodiments include co-axial inductors with fully embedded magnetic material and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the inclusion of magnetic materials in the manufacture of IC devices is currently problematic due to the leaching of magnetic materials (e.g., iron, alloys containing iron, and other ferromagnetic particles or elements) into processing baths. Accordingly, it is presently not feasible to integrate components, such as inductors, that include magnetic materials into IC substrates. However, embodiments described herein provide processing methods that allow for the integration of magnetic materials with currently available processing techniques. Particularly, embodiments include fully embedding magnetic materials, so that the magnetic materials are not exposed to processing environments where the leaching of magnetic materials is detrimental. For example, embodiments include embedding the magnetic materials so that the magnetic materials are not exposed to processing environments that have chemistries that may be negatively altered by leached magnetic materials, such as one or more of desmear baths, electroless baths, and subtractive etching baths. Since the magnetic material is isolated from such environments, there is no need to redesign the chemistries of processing baths or provide dedicated processing baths to handle the magnetic materials. Furthermore, isolating the magnetic material allows for subsequent changes to the magnetic material to be made without needing to adjust the chemistries of processing environments. This allows for quicker design times and reduces the cost of development. In embodiments, the magnetic material always interfaces with an organic resin material instead of copper surfaces. This provides better reliability in terms of interface delamination and blistering.

In accordance with an embodiment, the fully embedded magnetic material may be used to form a co-axial inductor. In the co-axial inductors described herein, the magnetic material may be a sheath that surrounds a plated through-hole. The magnetic sheath may be separated from the plated through-hole by a dielectric material. Additionally, a top surface and a bottom surface of the magnetic sheath may be covered by layers of dielectric material, and an outer sidewall surface of the magnetic sheath may be covered by a substrate core. Fully embedding the magnetic sheath simplifies the processing as described above.

Referring now to FIG. 1A, a cross-sectional illustration of an inductor is shown, in accordance with an embodiment. In an embodiment, inductor 110 may be disposed in and around a substrate core 105. In an embodiment, the substrate core 105 may be any suitable substrate on which build-up layers are formed. The substrate core 105 may be an organic material with or without reinforcement materials, such as glass fibers, particles, or the like.

In the illustrated embodiment, a single inductor 110 is shown in order to not obscure various aspects of the embodiment. However, it is to be appreciated that a plurality of inductors 110 may be electrically coupled in series or in parallel. For example, a plurality of inductors 110 may be coupled in series to produces a desired inductance, or a plurality of inductors 110 may be coupled in parallel to provide a multi-phase voltage regulator. For example, a multi-phase voltage regulator may be electrically coupled to an integrated circuit die to provide power management solutions.

As illustrated in FIG. 1A, the inductors 110 may include a through-hole that extends through the substrate core 105. The through-hole may be plated with a conductive layer 112. In an embodiment, the plated through-hole 112 may be copper or any other suitable conductive material. The plated through-holes 112 may be filled with a dielectric material 113, such as an epoxy. The plated through-holes 112 may have lids 119 formed on opposing surfaces. The lids 119 may be conductive materials, such as copper. In an embodiment, the lids may be electrically coupled to other inductors 110 or circuitry in the substrate core 105.

In order to increase the inductance of the inductor 110, a magnetic sheath 115 is formed around the plated through-holes 112. In an embodiment, the magnetic sheath 115 is fully embedded within dielectric materials. In an embodiment, a first surface $117_A$ of the magnetic sheath 115 is in direct contact with a surface of dielectric layer $108_A$, a second surface $117_B$ of the magnetic sheath 115 is in direct contact with a surface of dielectric layer $108_B$, a third (outer) surface $117_C$ is in direct contact with the substrate core 105, and a fourth (inner) surface $117_D$ is in direct contact with a dielectric layer 111. In an embodiment, dielectric layers $108_A$ and $108_B$ may be a prepreg material. The dielectric layers $108_A$ and $108_B$ may be laminated over surfaces of the substrate core 105. In an embodiment, the plated through-holes 112 may also pass through the dielectric layers $108_A$ and $108_B$. As such, the magnetic sheath 115 is not in contact with any conducting surface, including the lid 119 and the plated through-hole 112. As such, the magnetic sheath 115 is not exposed to processing environments that are used to form the plated through-hole 112 or lid 119, such as electroless plating environments. Accordingly, currently used processing chemistries may be used without magnetic materials leaching into processing baths.

In an embodiment, the magnetic sheath 115 may pass entirely through the substrate core 105. Surfaces $117_A$ and $117_B$ of the magnetic sheath 115 may be substantially coplanar with surfaces 106 and 107 of the substrate core 105. As used herein, "substantially coplanar" may refer to surfaces that are within +/−2 µm of being coplanar with each other. In an embodiment, the outer surface $117_C$ and inner surface $117_D$ of the magnetic sheath 115 may be substantially vertical. As used herein, "substantially vertical" may refer to surfaces that are within +/−5° from 90°. Additional embodiments may include an outer surface $117_C$ and an inner surface $117_D$ that are tapered surfaces.

The magnetic sheath 115 may be any suitable magnetic material. In an embodiment, the magnetic sheath 115 may be a dielectric material that includes magnetic particles. In one embodiment, the magnetic particles may include iron, alloys including iron, or any other elements or alloys that have magnetic properties. In an embodiment, the magnetic sheath 115 may have a relative permeability greater than 10. In an embodiment, the magnetic sheath 115 may have a relative permeability greater than 20.

Figure 1B:
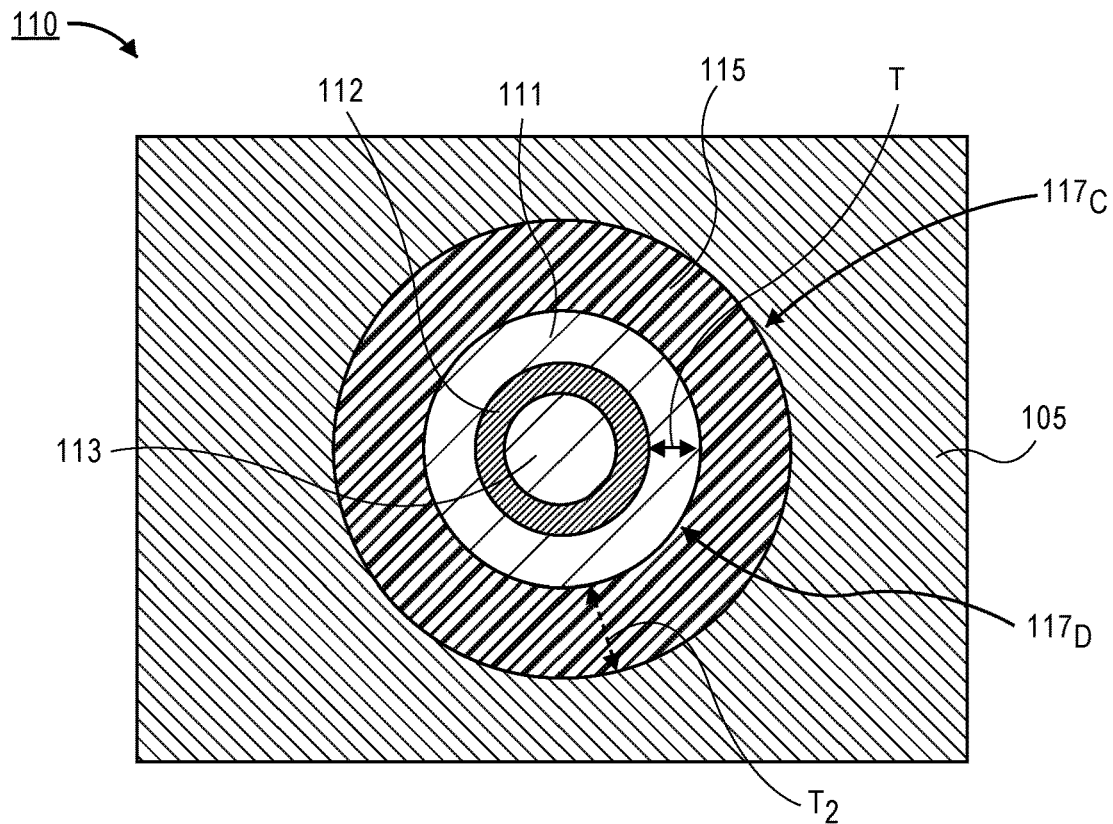
FIG. 1B is a cross-sectional illustration of the inductor in FIG. 1A, in accordance with an embodiment.

Referring now to FIG. 1B, a cross-sectional illustration of the inductor 110 along line 1-1' is shown, in accordance with an embodiment. FIG. 1B illustrates a cross-sectional view of an inductor 110 that has a substantially circular cross-section. In such embodiments, a circular magnetic sheath 115 may be surrounded by the substrate core 105. In an embodiment, the outer surface $117_C$ of the magnetic sheath 115 may be in direct contact with the substrate core 105. In an embodiment, the inner surface $117_D$ may be in direct contact with dielectric layer 111. Dielectric layer 111 may separate the inner surface $117_D$ of the magnetic sheath 115 from the plated through-hole via 112.

The inductance of the inductor 110 may be controlled by varying the thickness of each layer. For example, the thickness $T_1$ of the dielectric layer 111 may be minimized in order to increase the inductance of inductor 110. In an embodiment, the thickness $T_1$ may be 50 µm or less. Additionally, the thickness $T_2$ of the magnetic sheath 115 may be increased in order to increase the inductance of the inductor 110. In an embodiment, the thickness $T_2$ may be 50 µm or more. In embodiments, the outer diameter of each layer may coincide with standard mechanical drill bit sizes. For example, an outer diameter of the magnetic sheath 115 may be approximately 350 µm, the outer diameter of the dielectric layer 111 may be approximately 250 µm, and the outer diameter of the plated through-hole via 112 may be approximately 150 µm. Additional embodiments may include outer diameters that are any diameter, and it is to be appreciated that standard drill bit sizes do not limit the dimensions of various features in the inductor 110. For example, laser drilling may be used to provide different dimensions or custom drill bit sizes may be developed to fabricate desired inductances.

Figure 1C:
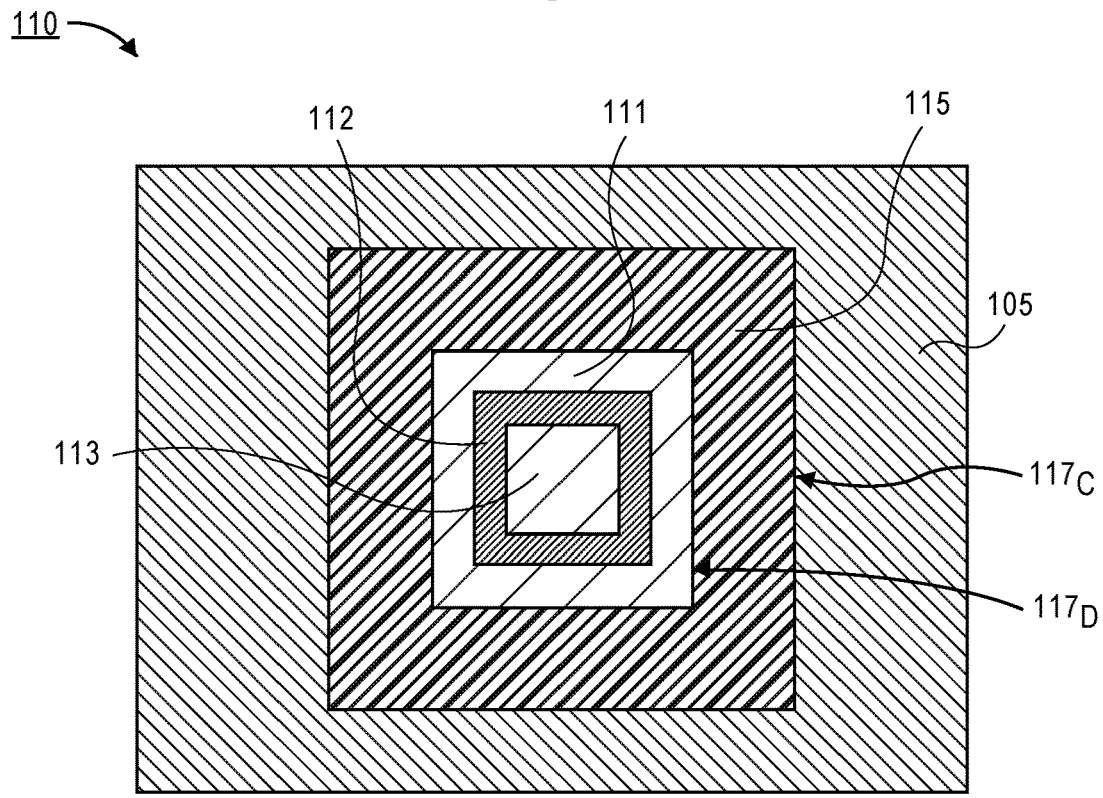
FIG. 1C is a cross-sectional illustration of the inductor in FIG. 1A, in accordance with an additional embodiment.

Additionally, it is to be appreciated that the cross-sectional shape of the inductor 110 is not limited to circular shapes, as shown in FIG. 1B. For example, FIG. 1C illustrates an inductor 110 that includes a substantially square cross-section. Additional embodiments may also include inductors 110 that have any other shaped cross-section, including rectangular, elliptical, or any other desired shape.

Referring now to FIGS. 2A-2J a process flow for forming an inductor with a sheath of magnetic material is shown, in accordance with an embodiment. As will be described below, embodiments include disposing the magnetic sheath into the substrate core and fully embedding the magnetic sheath in order to isolate the magnetic material from subsequent processing environments, such as electroless plating baths, desmear baths, and wet etching chemistries. Accordingly, existing processing operations may be used without the need to have dedicated processing environments to accommodate the magnetic material.

Figure 2A:
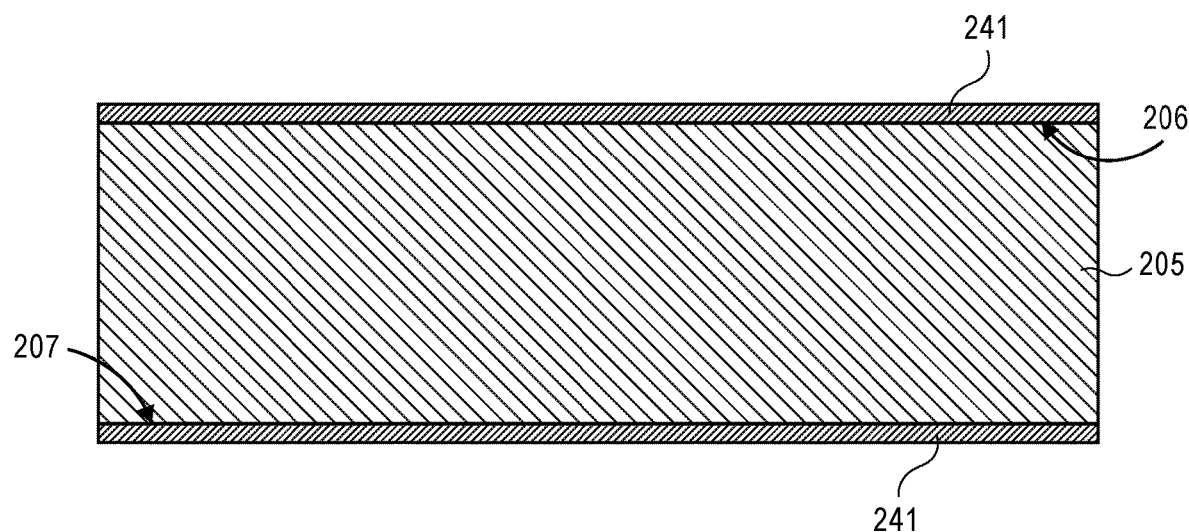
FIG. 2A is a cross-sectional illustration of a substrate core, in accordance with an embodiment.

Referring now to FIG. 2A, a cross-sectional illustration of a substrate core 205 is shown, in accordance with an embodiment. In an embodiment, the substrate core 205 may be received with metal layers 241, such as copper, formed over a first surface 206 and second surface 207 of the substrate core 205.

Figure 2B:
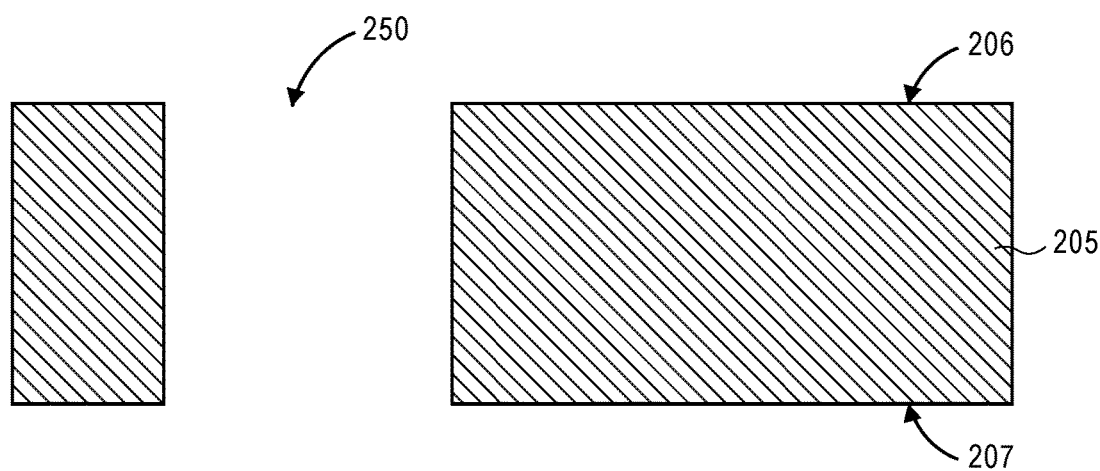
FIG. 2B is a cross-sectional illustration of the substrate core after an opening is formed through the substrate core, in accordance with an embodiment.

Referring now to FIG. 2B, a cross-sectional illustration of the substrate core 205 is shown after an opening 250 is formed through the substrate core 205, in accordance with an embodiment. In an embodiment, the opening 250 may be formed through the substrate core 205 with any suitable process. For example, the opening 250 may be formed with a mechanical drilling process, a laser drilling process, a wet or dry etching process, or the like. Embodiments may also include an etching process that removes the metal layers 241 from the first surface 206 and the second surface 207 of the substrate core 205. In an embodiment, the opening 250 may be cleaned with a desmear process. In the illustrated embodiment, the sidewalls of the opening 250 are substantially vertical. However it is to be appreciated that embodiments may also include sidewalls of the opening 250 that are tapered or otherwise shaped, depending on the process used to form the opening 250.

Figure 2C:
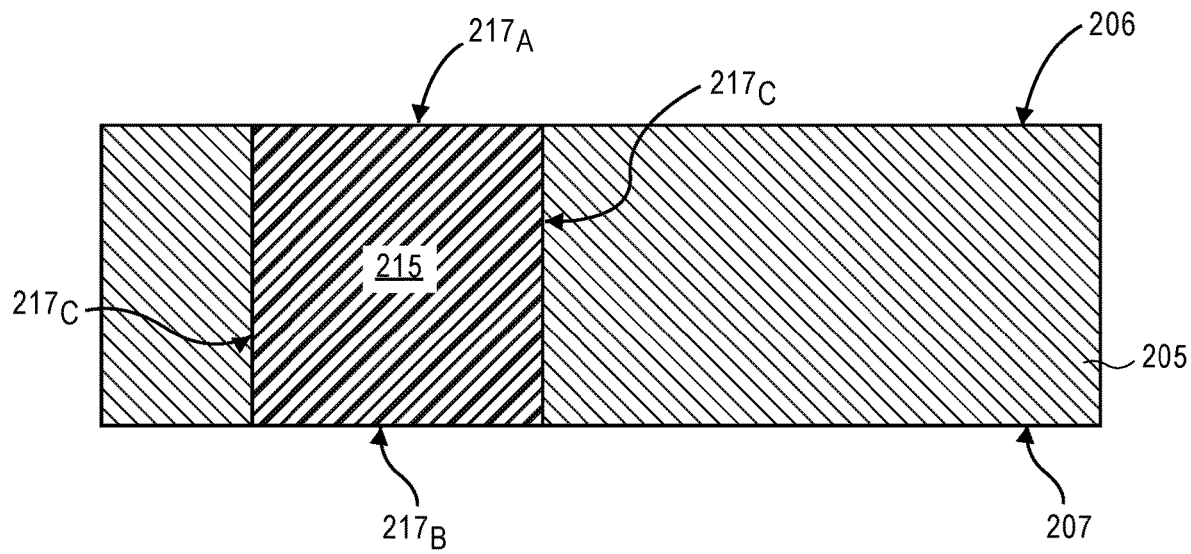
FIG. 2C is a cross-sectional illustration of the substrate after a magnetic material is disposed in the opening, in accordance with an embodiment.

Referring now to FIG. 2C, a cross-sectional illustration of the substrate core after a magnetic material is disposed in the opening is shown, in accordance with an embodiment. In an embodiment, the magnetic sheath 215 may be disposed in the opening 250 with any suitable process. In an embodiment, the magnetic sheath 215 may be plugged into the opening 250. After the magnetic material is plugged into the opening 250, a polishing process, a grinding process, or the like (e.g., chemical mechanical polishing (CMP)) may be used to remove any overburden of the magnetic material 250. The magnetic material used to form the magnetic sheath 215 may be cured.

In an embodiment, the magnetic sheath 215 may have a first surface $217_A$ that is substantially coplanar with a first surface 206 of the substrate core 205, and the magnetic sheath 215 may have a second surface $217_B$ that is substantially coplanar with a second surface 207 of the substrate core 205. Embodiments may also include an outer sidewall surface $217_C$ that is in direct contact with the substrate core 205. The outer surface $217_C$ may conform to the surfaces of the opening 250. As such, the profile of the outer surface $217_C$ may match the profile of the opening 250 (i.e., vertical sidewalls, tapered sidewalls, etc.).

Figure 2D:
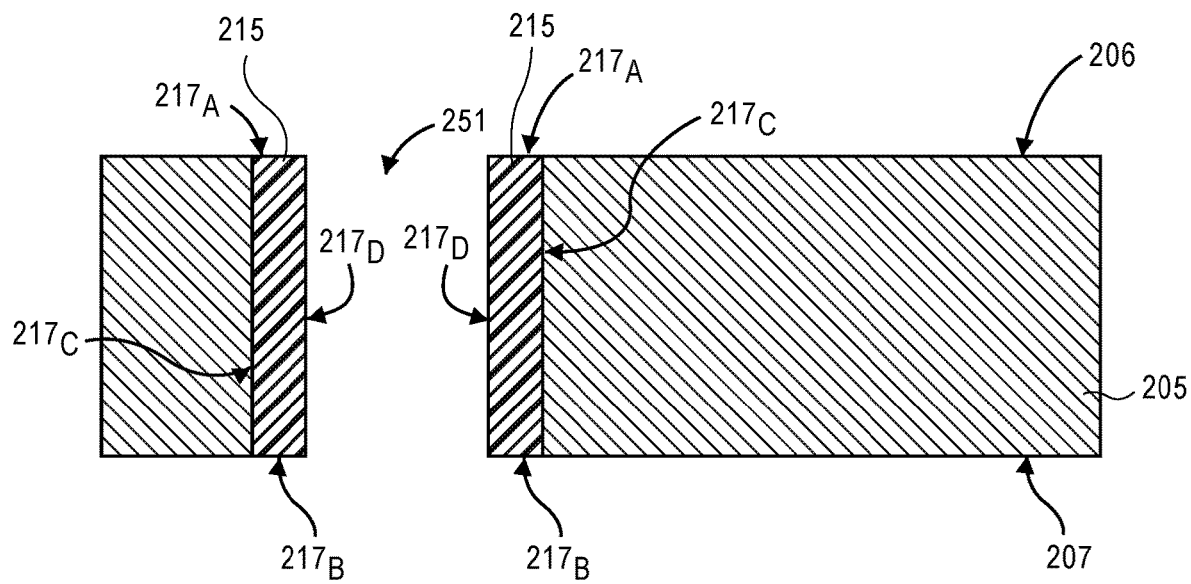
FIG. 2D is a cross-sectional illustration of the substrate core after an opening is formed through the magnetic material, in accordance with an embodiment.

Referring now to FIG. 2D, a cross-sectional illustration of the substrate after an opening is formed through the magnetic sheath is shown, in accordance with an embodiment. In an embodiment, opening 251 may be formed with an suitable dry process. A dry process may be used in order to not expose the magnetic sheath 215 to a processing bath (e.g., a wet etching bath). Embodiments may include a mechanical drilling process or a laser drilling process. In the illustrated embodiment, the inner surface $217_D$ formed by opening 251 is substantially vertical. However it is to be appreciated that embodiments may also include inner surfaces $217_D$ formed by opening 251 that are tapered or otherwise shaped, depending on the process used to form the opening 251.

Figure 2E:
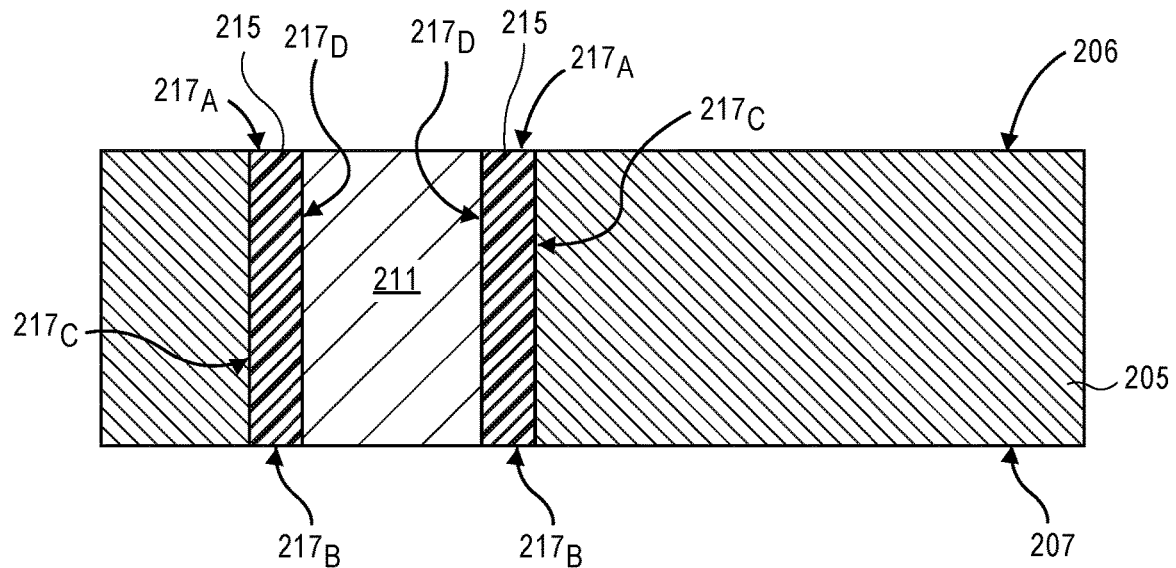
FIG. 2E is a cross-sectional illustration of the substrate core after a dielectric material is disposed in the opening through the magnetic material, in accordance with an embodiment.

Referring now to FIG. 2E, a cross-sectional illustration of the substrate core 205 after a first plugging layer 211 is disposed into the openings 251 is shown, in accordance with an embodiment. In an embodiment, the first plugging layer 211 may be disposed into the openings 251 with a plugging process, as is known in the art. In an embodiment, the first plugging layer 213 may be a dielectric material, such as an epoxy or any other suitable material. In an embodiment, the first plugging layer 211 may be planarized with a top surface $217_A$ and bottom surface $217_B$ of the magnetic sheath 215 using a polishing or grinding process. In some embodiments, the first plugging layer 211 may be cured with a curing process. As illustrated, the magnetic sheath 215 is now embedded on two surfaces, (i.e., the outer surface $217_C$ by the substrate core 205, and the inner surface $217_D$ by the first plugging layer 211).

Figure 2F:
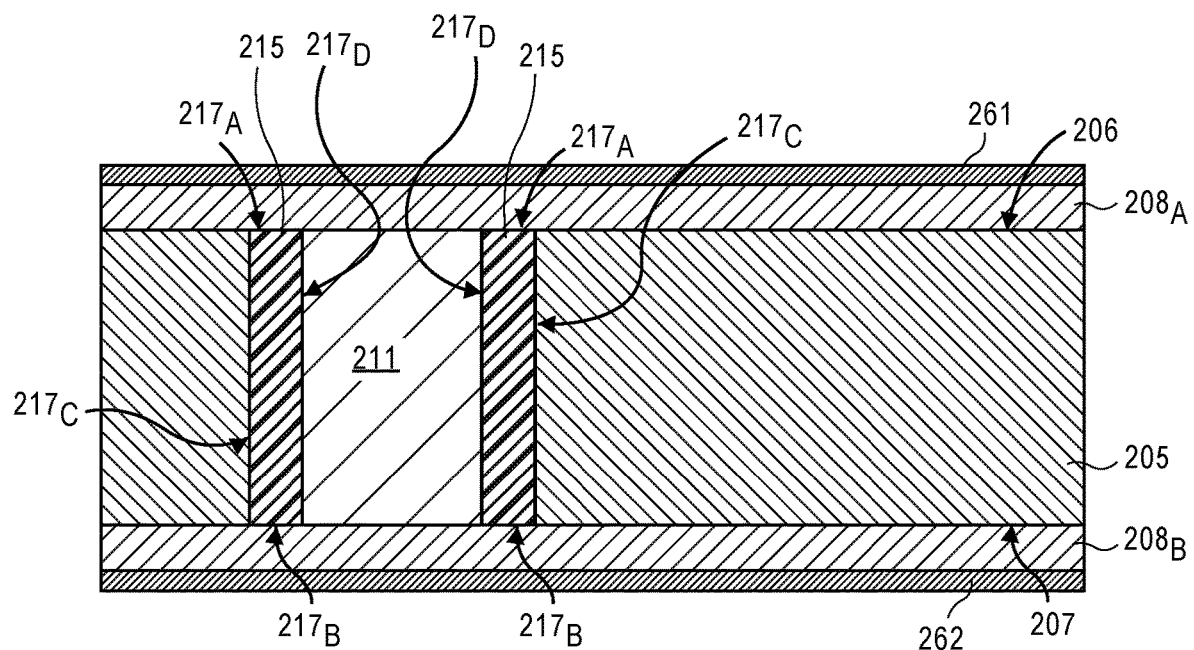
FIG. 2F is a cross-sectional illustration of the substrate core after a dielectric layer is disposed over first and second surfaces of the magnetic material, in accordance with an embodiment.

Referring now to FIG. 2F, a cross-sectional illustration of the substrate core 205 after dielectric layers $208_A$ and $208_B$ are disposed over the first surface $217_A$ and the second surface $217_B$ of the magnetic sheath 215 is shown, in accordance with an embodiment. In an embodiment, the dielectric layers $208_A$ and $208_B$ may be laminated over the first surface 206 and the second surface 207 of the substrate core 205, respectively. The lamination may be implemented with a hot press. In additional embodiments, the dielectric layers $208_A$ and $208_B$ may be disposed over the substrate core 205 with any other dry deposition process, such as printing, chemical vapor deposition (CVD), physical vapor deposition (PVD), plasma enhanced CVD (PECVD), or the like. In an embodiment, the dielectric layers $208_A$ and $208_B$ may be in direct contact with the first surface $217_A$ and the second surface $217_B$ of the magnetic sheath 215, respectively. Accordingly, embodiments include a magnetic sheath 215 that is fully embedded by the substrate core 205, the first plugging layer 211, and the first and second dielectric layers $208_A$ and $208_B$. As such, subsequent processing operations may be implemented without exposing the magnetic sheath 215 to the processing environments.

In the illustrated embodiment, conductive layers 261, 262 are disposed over the first and second dielectric layers $208_A$ and $208_B$. In some embodiments the conductive layers 261 and 262 may be formed on the dielectric layers $208_A$ and $208_B$ prior to the dielectric layers $208_A$ and $208_B$ being disposed over the substrate core 205. In other embodiments, one or both of the conductive layers over dielectric layers $208_A$ and $208_B$ may be omitted.

Figure 2G:
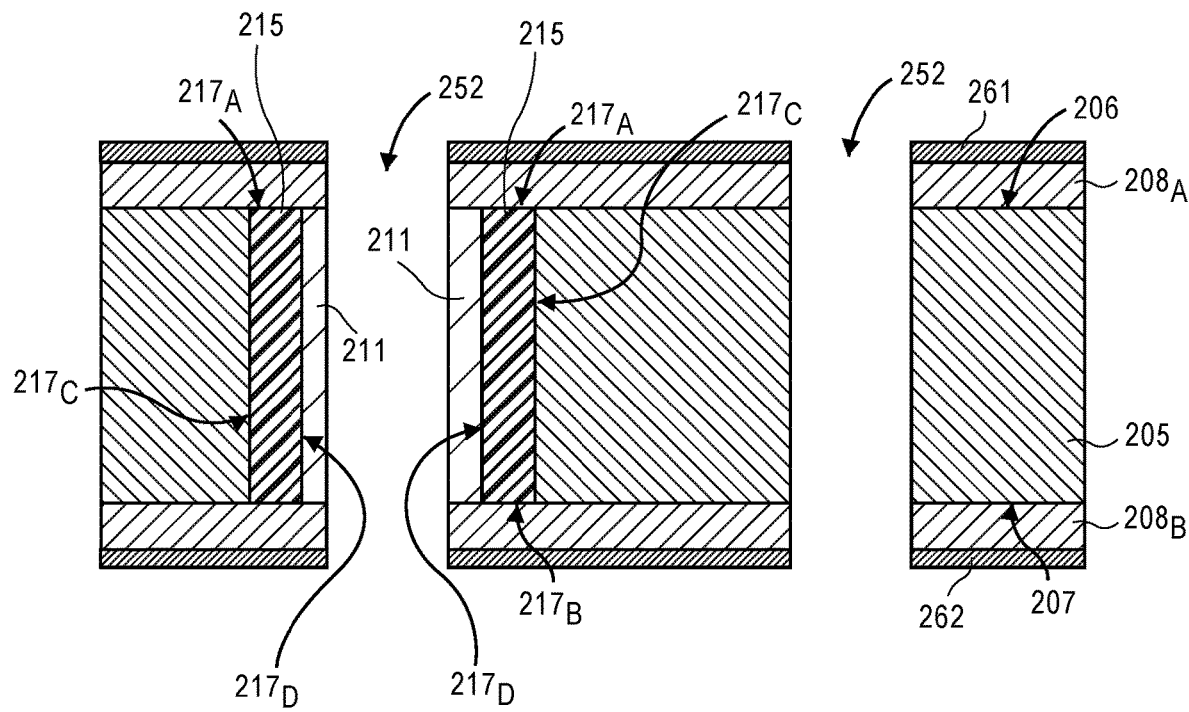
FIG. 2G is a cross-sectional illustration of the substrate core after through-hole vias are formed through the substrate core, in accordance with an embodiment.

Referring now to FIG. 2G, a cross-sectional illustration of the substrate core 205 after through-hole vias 252 are formed through the substrate core 205 and the first plugging layer 211 is shown, in accordance with an embodiment. In an embodiment, the through-hole vias 252 may be formed with a mechanical drilling process. Additional embodiments may include forming the through-hole vias 252 with other processes, such as laser drilling, etching, or the like. In the illustrated embodiment, the through-hole vias 252 may have substantially vertical sidewalls. However, additional embodiments may include through-hole vias with any profile (e.g., tapered, or the like) depending on the process used to form the through-hole vias 252. In an embodiment, the through-hole vias 252 are also formed through the dielectric layers $208_A$ and $208_B$ and the conductive layers 261 and 262. After the formation of the through-hole vias 252, embodiments may also include a desmear process.

As illustrated, a through-hole via 252 may be formed through the first plugging layer 211. The through-hole via 252 may be formed so that a portion of the first plugging layer 211 remains. This allows for the inner surface $217_D$ of the magnetic sheath 215 to remain protected from the processing environment by the remaining portions of the first plugging layer 211. Accordingly, the magnetic sheath 215 is not exposed to the through-hole via formation process environment or the desmear environment since it is fully embedded.

Furthermore, through-hole vias 252 may also be formed in non-inductor regions of the substrate core 205 as well. For example, the through-hole via on the right in FIG. 2G may be in a non-inductor region. It is to be appreciate that both through-hole vias 252 may be formed with the same sized drill-bit, and therefore, reduces manufacturing complexity.

Figure 2H:
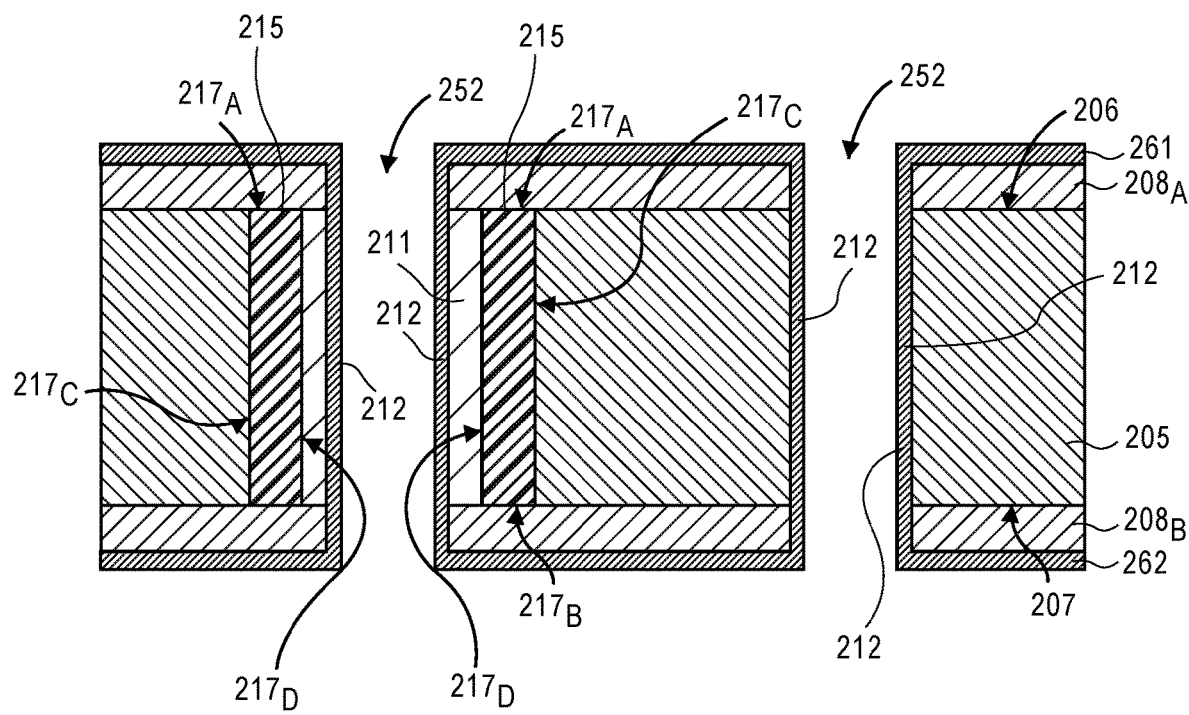
FIG. 2H is a cross-sectional illustration of the substrate core after the through-hole vias are plated, in accordance with an embodiment.

Referring now to FIG. 2H, a cross-sectional illustration of the substrate core 205 after the through-hole vias are plated is shown, in accordance with an embodiment. In an embodiment, conductive material may be disposed along the sidewalls of the through-hole vias to form plated through-hole vias 212 along the first plugging layer 211 in the inductor region and along a surface of the substrate core 205 in the non-inductor regions. The conductive material may be disposed on the sidewalls of the through-hole vias 212 with a plating process, such as an electroless plating process. In an embodiment, the conductive material may be copper or any other conductive material. In such embodiments, magnetic sheath 215 is not exposed to the electroless plating bath since it is fully embedded by the substrate core 205, the first plugging layer 211, and the first and second dielectric layers $208_A$ and $208_B$.

Figure 2I:
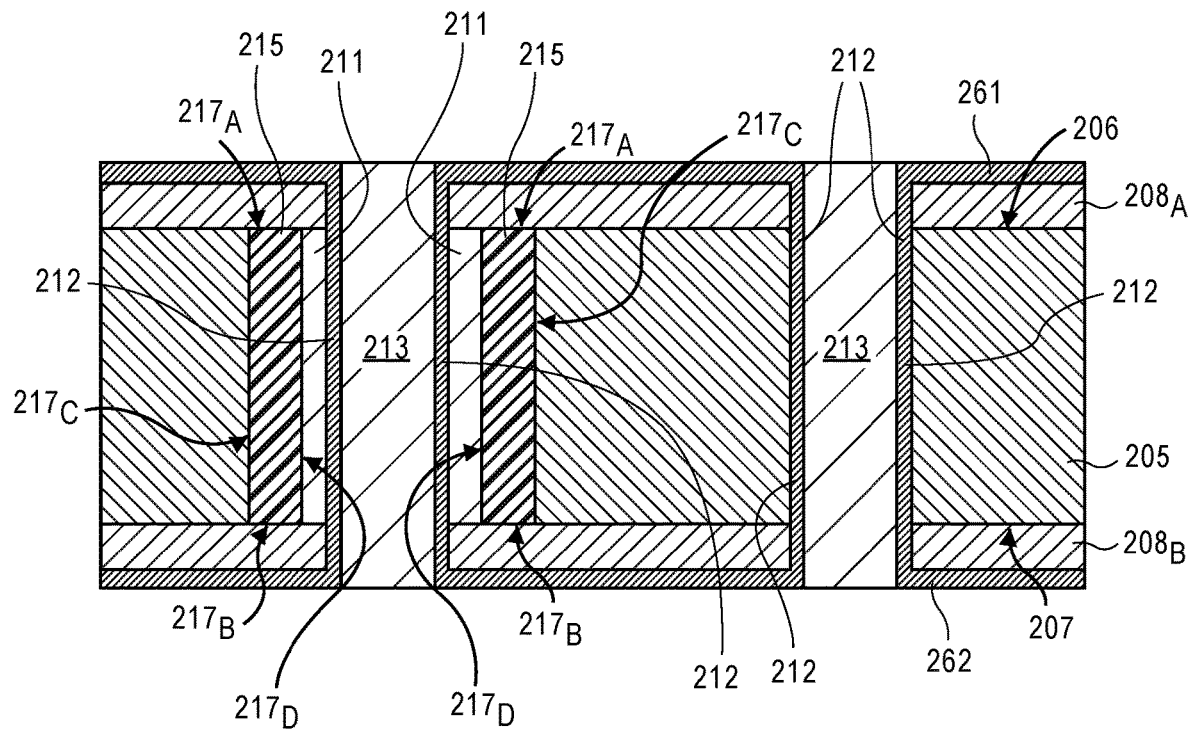
FIG. 2I is a cross-sectional illustration of the substrate core after the through-hole vias are filled with a dielectric layer, in accordance with an embodiment.

Referring now to FIG. 2I, a cross-sectional illustration of the substrate core 205 after a second plugging layer 213 is disposed into the openings 252 is shown, in accordance with an embodiment. In an embodiment, the second plugging layer 213 may be disposed into the openings 252 with a plugging process, as is known in the art. In an embodiment, the second plugging layer 213 may be a dielectric material, such as an epoxy or any other suitable material. In an embodiment, the second plugging layer 213 may be the same material as first plugging layer 211. In an additional embodiment, the second plugging layer 213 may be a different material than the first plugging layer 211. In an embodiment, the second plugging layer 213 may be planarized with a top surface of the through-hole vias using a polishing or grinding process. In some embodiments, the second plugging layer 213 may be cured with a curing process. In some embodiments, the second plugging layer 213 may be omitted and the through-hole vias 252 may be air filled.

Figure 2J:
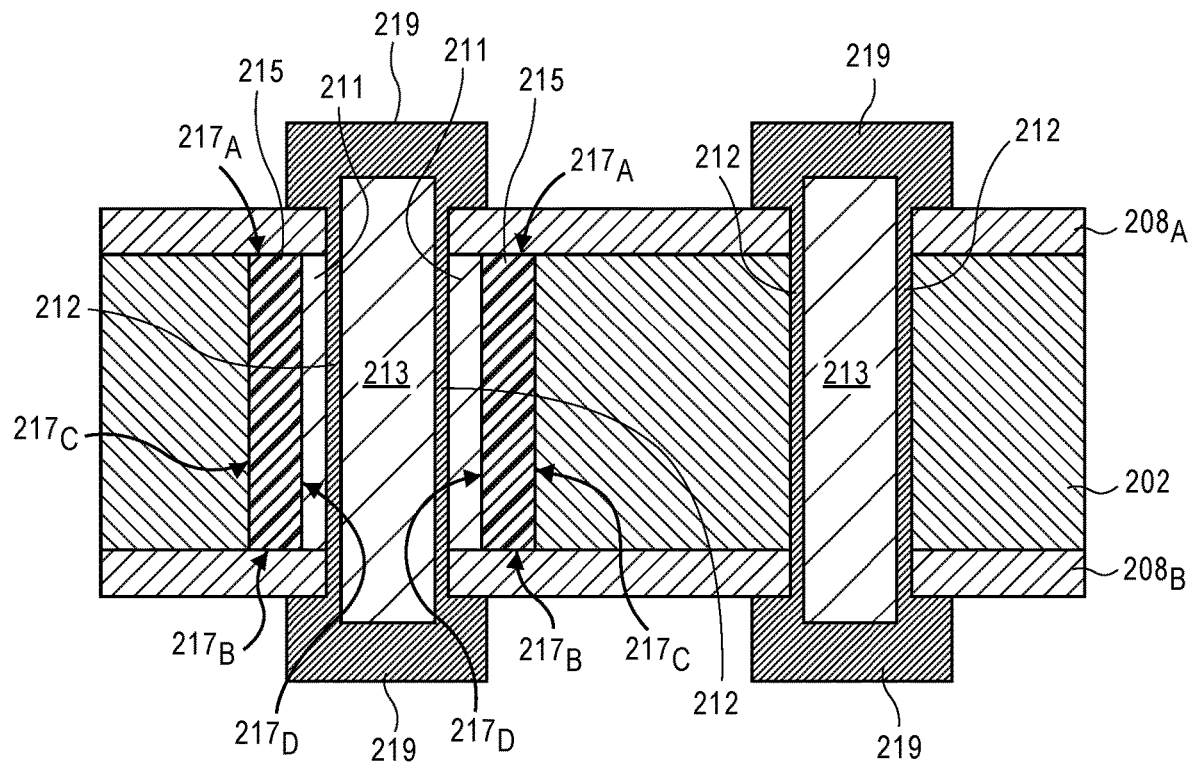
FIG. 2J is a cross-sectional illustration of the substrate core after lids are formed over the plated through-hole vias, in accordance with an embodiment.

Referring now to FIG. 2J, a cross-sectional illustration of the substrate core 205 after lids 219 are formed over the plated through-hole vias 212 is shown, in accordance with an embodiment. In an embodiment, the lids 219 are conductive lids and may be formed with any deposition process. For example, the lids 218 may be formed with an electroless plating process. After the plating, a subtractive etching process may be implemented to define the pattern of the lids 218 and remove the conductive layers 261 and 262. In some embodiments, the subtractive etching process may also be utilized to form conductive traces along surfaces of the dielectric layers $208_A$ and $208_B$ used to connect the plated through-hole vias 212 to other inductors and circuitry in or on the substrate core 205.

Figure 3:
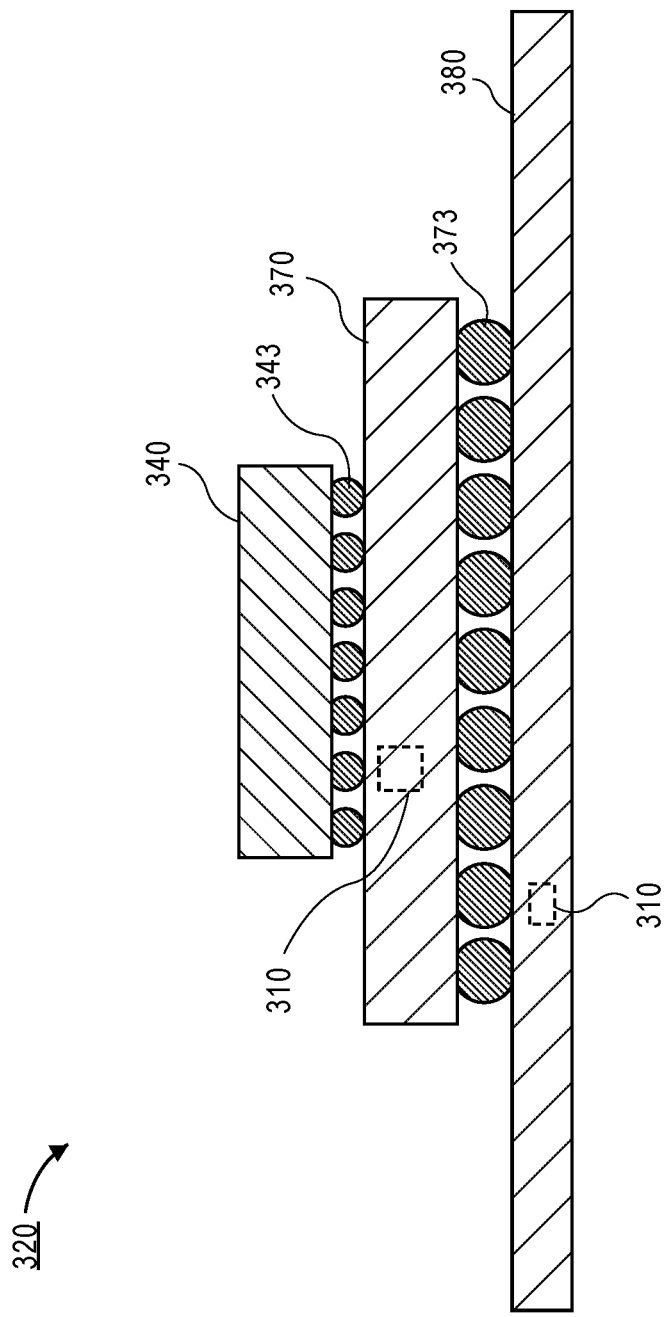
FIG. 3 is a cross-sectional illustration of an electronic package that includes an inductor, in accordance with an embodiment

Referring now to FIG. 3, a cross-sectional illustration of a packaged system 310 is shown, in accordance with an embodiment. In an embodiment, the packaged system 310 may include a die 340 electrically coupled to a package substrate 370 with solder bumps 343. In additional embodiments, the die 340 may be electrically coupled to the package substrate 340 with any suitable interconnect architecture, such as wire bonding or the like. The package substrate 340 may be electrically coupled to a board, such as a printed circuit board (PCB) with solder bumps 373 or any other suitable interconnect architecture, such as wire bonding or the like.

In an embodiment, an inductor 310 similar to embodiments described above may be integrated into the package substrate 370 or the board 380, or the package substrate 370 and the board 380. Embodiments include any number of inductors 310 formed into the package substrate 370 and the board 380. For example, a plurality of inductors 310 may be integrated into the circuitry of the package substrate 370 or the board 380, or the package substrate 370 and the board 380 for power management, filtering, or any other desired use.

Figure 4:
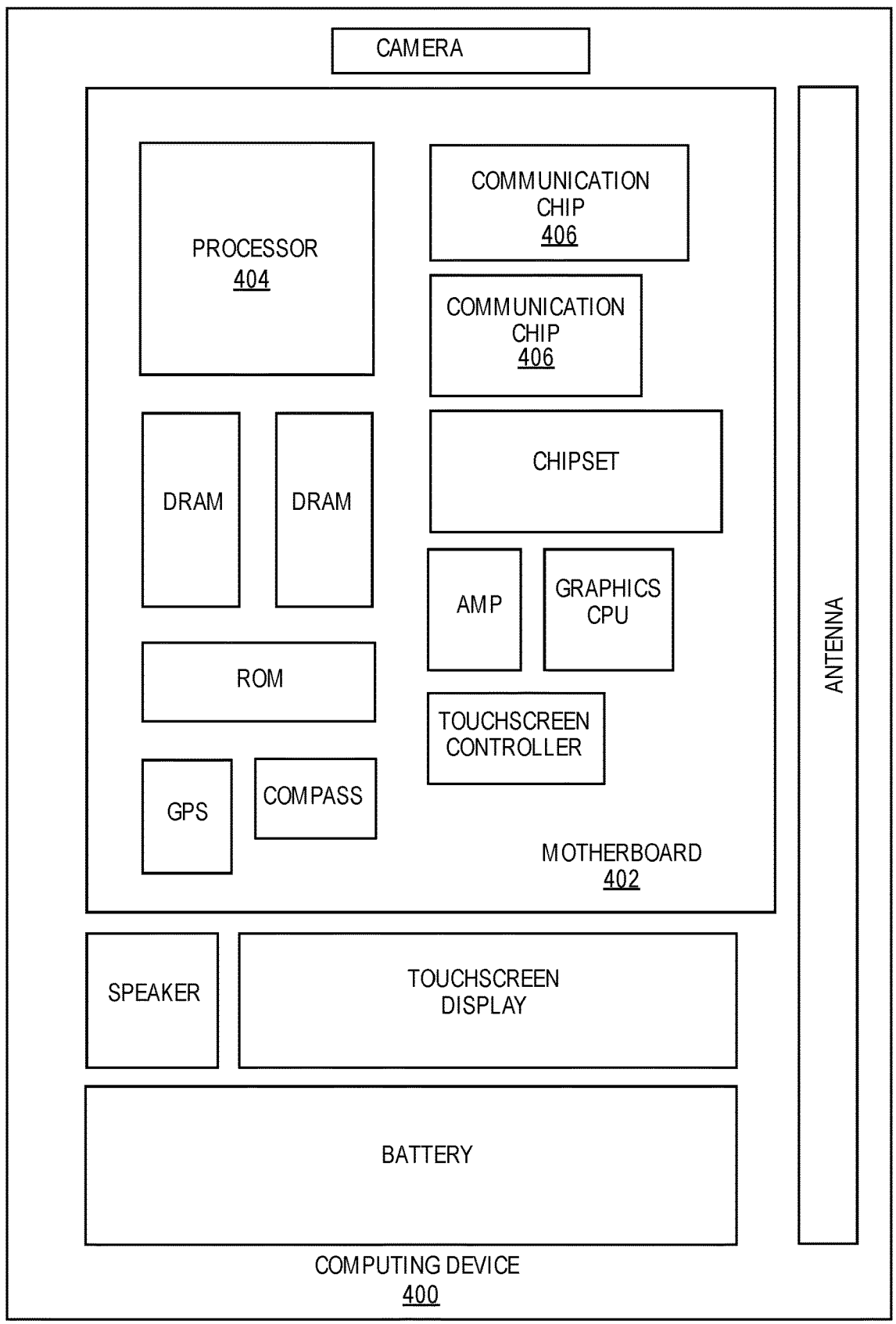
FIG. 4 is a schematic of a computing device built in accordance with an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may include an inductor with a fully embedded magnetic sheath, in accordance with embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices that include an inductor with a fully embedded magnetic sheath, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 may include an inductor, comprising: a substrate core; a conductive through-hole disposed through the substrate core; and a magnetic sheath around the conductive through hole, wherein the magnetic sheath is separated from the plated through hole by a plugging layer comprising a dielectric material.

Example 2 may include the inductor of Example 1, wherein a first surface of the magnetic sheath is substantially coplanar with a first surface of the substrate core and wherein a second surface of the magnetic sheath is substantially coplanar with a second surface of the substrate core.

Example 3 may include the inductor of Example 1 or Example 2, wherein a first layer comprising a dielectric material is in contact with the first surface of the magnetic sheath, and wherein a second layer comprising a dielectric material is in contact with the second surface of the magnetic sheath.

Example 4 may include the inductor of Examples 1-3, wherein the magnetic sheath is fully embedded.

Example 5 may include the inductor of Examples 1-4, wherein a thickness of the plugging layer separating the magnetic sheath from the conductive through hole is 50 µm or less.

Example 6 may include the inductor of Examples 1-5, wherein a thickness of the magnetic sheath is 50 µm or greater.

Example 7 may include the inductor of Examples 1-6, wherein a diameter of the conductive through via is the same diameter as conductive through vias disposed in non-inductor regions of the substrate core.

Example 4 may include the inductor of Examples 1-7, wherein a permeability of the magnetic sheath is greater than 10.

Example 9 may include the inductor of Examples 1-8, wherein the permeability of the magnetic sheath is greater than 20.

Example 10 may include the inductor of Examples 1-9, further comprising a second plugging layer filling the conductive through-hole, wherein the second plugging layer comprises a dielectric material.

Example 11 may include the inductor of Examples 1-10, wherein the second plugging layer is the same material as the plugging layer separating the magnetic sheath from the conductive through-hole.

Example 12 may include a method of forming an inductor, comprising: forming a first opening through a substrate core; filling the first opening with a magnetic material; forming a second opening through the magnetic material to define a magnetic sheath; disposing a plugging layer comprising a dielectric material into the second opening; disposing a first layer comprising a dielectric material over a first surface of the magnetic sheath; disposing a second layer comprising a dielectric material over a second surface of the magnetic sheath; forming a third opening through the plugging layer, wherein surfaces of the magnetic sheath are separated from the third opening by the plugging layer; and disposing conductive layers over sidewalls of the third opening to form a conductive through via.

Example 13 may include the method of Example 12, wherein a first surface of the magnetic sheath is substantially coplanar with a first surface of the substrate core, and wherein a second surface of the magnetic sheath is substantially coplanar with a second surface of the substrate core.

Example 14 may include the method of Example 12 or Example 13, wherein the magnetic sheath is fully embedded by the substrate core, the plugging layer, the first layer comprising a dielectric material, and the second layer comprising a dielectric material.

Example 15 may include the method of Examples 12-14, wherein one or more of the first opening, the second opening, and the third opening are formed with a mechanical drilling process.

Example 16 may include the method of Examples 12-15, wherein one or more of the first opening, the second opening, and the third opening are formed with a laser drilling process.

Example 17 may include the method of Examples 12-16, wherein a diameter of the third opening is equal to a diameter of a plated through-hole via formed through the substrate core in a non-inductor region.

Example 18 may include the method of Examples 12-17, further comprising: disposing a second plugging layer comprising a dielectric material into the third opening.

Example 19 may include the method of Examples 12-18, wherein the first plugging layer and the second plugging layer comprise the same dielectric material.

Example 20 may include the method of Examples 12-19, wherein the third opening is formed through the first layer comprising a dielectric material and the second layer comprising a dielectric material.

Example 21 may include the method of Examples 12-20, wherein a thickness of the plugging layer separating the magnetic sheath from the conductive through via is 50 µm or less, and wherein a thickness of the magnetic sheath is 50 µm or greater.

Example 22 may include the method of Examples 12-21, wherein a permeability of the magnetic sheath is greater than 20.

Example 23 may include an integrated circuit package comprising: an integrated circuit die; a multi-phase voltage regulator electrically coupled to the integrated circuit die, wherein the multi-phase voltage regulator comprises: a substrate core; a plurality of inductors, wherein the inductors comprise: a conductive through-hole disposed through the substrate core; a plugging layer comprising a dielectric material surrounding the conductive through-hole; a magnetic sheath around the plugging layer, wherein the magnetic sheath is separated from the plated through hole by the plugging layer; a first layer comprising a dielectric material disposed over a first surface of the magnetic sheath; and a second layer comprising a dielectric material disposed over a second surface of the magnetic sheath.

Example 24 may include the integrated circuit package of Example 23, wherein the magnetic sheath is fully embedded by the substrate core, the plugging layer, the first layer comprising a dielectric material, and the second layer comprising a dielectric material.

Example 25 may include the integrated circuit package of Example 23 or Example 24, wherein a permeability of the magnetic sheath is greater than 20.

What is claimed is:

1. A method of forming an inductor, comprising:
    forming a first opening through a substrate core;
    filling the first opening with a magnetic material;
    forming a second opening through the magnetic material to define a magnetic sheath;
    disposing a plugging layer comprising a dielectric material into the second opening;
    disposing a first layer comprising a dielectric material over a first surface of the magnetic sheath;
    disposing a second layer comprising a dielectric material over a second surface of the magnetic sheath;
    forming a third opening through the plugging layer, wherein surfaces of the magnetic sheath are separated from the third opening by the plugging layer; and
    disposing conductive layers over sidewalls of the third opening to form a conductive through via.

2. The method of claim 1, wherein a first surface of the magnetic sheath is substantially coplanar with a first surface of the substrate core, and wherein a second surface of the magnetic sheath is substantially coplanar with a second surface of the substrate core.

3. The method of claim 2, wherein the magnetic sheath is fully embedded by the substrate core, the plugging layer, the first layer comprising a dielectric material, and the second layer comprising a dielectric material.

4. The method of claim 1, wherein one or more of the first opening, the second opening, and the third opening are formed with a mechanical drilling process.

5. The method of claim 4, wherein one or more of the first opening, the second opening, and the third opening are formed with a laser drilling process.

6. The method of claim 1, wherein a diameter of the third opening is equal to a diameter of a plated through-hole via formed through the substrate core in a non-inductor region.

7. The method of claim 1, further comprising: disposing a second plugging layer comprising a dielectric material into the third opening.

8. The method of claim 7, wherein the plugging layer and the second plugging layer comprise the same dielectric material.

9. The method of claim 1, wherein the third opening is formed through the first layer comprising a dielectric material and the second layer comprising a dielectric material.

10. The method of claim 1, wherein a thickness of the plugging layer separating the magnetic sheath from the conductive through via is 50 µm or less, and wherein a thickness of the magnetic sheath is 50 µm or greater.

11. The method of claim 1, wherein a permeability of the magnetic sheath is greater than 20.

12. A method of fabricating an inductor, the method comprising:
    forming a substrate core;
    forming a conductive through-hole through the substrate core;
    forming a magnetic sheath around the conductive through-hole, wherein the magnetic sheath is separated from the conductive through-hole by a first plugging layer comprising a dielectric material; and
    forming a second plugging layer filling the conductive through-hole, wherein the second plugging layer comprises a dielectric material.

13. The method of claim 12, wherein a first surface of the magnetic sheath is substantially coplanar with a first surface of the substrate core and wherein a second surface of the magnetic sheath is substantially coplanar with a second surface of the substrate core.

14. The method of claim 13, wherein a first layer comprising a dielectric material is in contact with the first surface of the magnetic sheath, and wherein a second layer comprising a dielectric material is in contact with the second surface of the magnetic sheath.

15. The method of claim 14, wherein the magnetic sheath is fully embedded.

16. The method of claim 12, wherein a thickness of the first plugging layer separating the magnetic sheath from the conductive through-hole is 50 microns or less.

17. The method of claim 12, wherein a thickness of the magnetic sheath is 50 microns or greater.

18. The method of claim 12, wherein a diameter of the conductive through-hole is the same diameter as conductive through vias disposed in non-inductor regions of the substrate core.

19. The method of claim 12, wherein a permeability of the magnetic sheath is greater than 10.

20. The method of claim 19, wherein the permeability of the magnetic sheath is greater than 20.

21. The method of claim 12, wherein the second plugging layer is the same material as the first plugging layer separating the magnetic sheath from the conductive through-hole.

* * * * *